(12) United States Patent
Kim et al.

(10) Patent No.: US 6,538,804 B1
(45) Date of Patent: Mar. 25, 2003

(54) PLANAR WAVEGUIDE-TYPE OPTICAL AMPLIFIER SWITCH

(75) Inventors: Kyong Hon Kim, Daejon-Shi (KR); Yong Gyu Choi, Daejon-Shi (KR); Hak Kyu Lee, Daejon-Shi (KR); Min Yong Jeon, Daejon-Shi (KR); Joon Tae Ahn, Daejon-Shi (KR); Dong Sung Lim, Daejon-Shi (KR); Ho Young Kim, Daejon-Shi (KR); Do Il Chang, Daejon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 0 days.

(21) Appl. No.: 09/433,455

(22) Filed: Nov. 4, 1999

(30) Foreign Application Priority Data

Jul. 26, 1999 (KR) .............................. 99-30308

(51) Int. Cl.$^7$ ............................ H01S 3/00; G02F 1/295
(52) U.S. Cl. ........................................ 359/341.1; 385/9
(58) Field of Search ............................... 359/128, 320, 359/299, 333, 341, 341.1, 349; 372/6; 385/16, 17, 40, 5, 9, 8

(56) References Cited

U.S. PATENT DOCUMENTS

| | | | | |
|---|---|---|---|---|
| 4,759,595 A | * | 7/1988 | Buord et al. | 350/96.13 |
| 4,778,235 A | * | 10/1988 | Fugiwara | 350/96.13 |
| 5,039,190 A | * | 8/1991 | Blonder et al. | 359/341 |

(List continued on next page.)

FOREIGN PATENT DOCUMENTS

| | | | | |
|---|---|---|---|---|
| EP | 0867985 | | 3/1997 | H01S/3/06 |
| JP | 11174389 A | * | 7/1999 | G02F/1/01 |
| NL | 0867985 A1 | * | 9/1998 | H01S/3/06 |

OTHER PUBLICATIONS

Desuirvre, E., 'Analysis of Gain Difference Between Forward– and Backward–Pumped Erbium–Doped Fiber amplifiers in the Saturation Region', IEEE Photonics Technology Letters, Jul. 1992, pp. 711–714.*
Cocorallo et al. 'Silicon Thermooptical Micromodulator with 700–kHz—3dB Bandwith', IEEE Photonics Technology Letters, Apr. 1995, pp. 363–365.*
Yan et al. 'Erbium–doped phosphated glass waveguide on silicon with 4/1 dB/cm gain at 1.535 micrometers' Nov. 17, 1997, pp. 2922–2924.*
Okayama et al., Reduction of Voltage–Length Product for Y–Branch Digital Optical Switch, Feb. 1992, pp. 379–387.*

*Primary Examiner*—Thomas G. Black
*Assistant Examiner*—Deandra M. Hughes
(74) *Attorney, Agent, or Firm*—Cohen, Pontani, Lieberman & Pavane (57) ABSTRACT

A planar waveguide-type optical amplifier switch is disclosed. The switch is developed with the purpose of solving the problems that the conventional waveguide-type optical switch, which has been being used in the optical communication technique, has an optical loss and thereby requires an external optical amplifier which makes the whole devices not suitable for forming an integrated compact device. The disclosed switch performs switching function from the refractive index change in the optical waveguides induced by electrical or optical controls as well as amplifying function of the optical signal, when it passes through the waveguides, from use of optical waveguides formed of a fluorescence emitting material with an optical pumping and a wavelength division multiplexing (WDM) optical waveguide-type coupler. The optical amplifier switch scheme, which provides a simultaneous optical switching and amplification in an optical waveguide form, allows the device fabricable in a compact integrated manner and more useful in practical applications. The optical amplifier switch in accordance with the present invention can replace the conventional optical switches of the prior art, and can promote technical development in the areas of high-capacity optical communication systems, massive optical signal processing, optical switching, optical computing, and so on.

5 Claims, 7 Drawing Sheets

U.S. PATENT DOCUMENTS

| | | | | |
|---|---|---|---|---|
| 5,136,670 A | * | 8/1992 | Shigematsu et al. | 385/42 |
| 5,329,601 A | * | 7/1994 | Nakamura | 385/41 |
| 5,502,781 A | * | 3/1996 | Li et al. | 385/4 |
| 5,530,956 A | * | 6/1996 | Hiraoka et al. | 385/122 |
| 5,583,957 A | * | 12/1996 | Blow | 385/21 |
| 5,754,714 A | * | 5/1998 | Suzuki et al. | 385/5 |
| 5,875,272 A | * | 2/1999 | Kewitsch et al. | 385/37 |
| 5,920,666 A | * | 7/1999 | Digonnet et al. | 385/16 |
| 5,940,208 A | * | 8/1999 | Blaszyk et al. | 359/341 |
| 5,970,185 A | * | 10/1999 | Baker et al. | 385/3 |
| 5,970,187 A | * | 10/1999 | Notten et al. | 385/16 |
| 6,104,527 A | * | 8/2000 | Yang | 359/341 |
| 6,122,416 A | * | 9/2000 | Ooba et al. | 385/16 |
| 6,201,909 B1 | * | 3/2001 | Kewitsch et al. | 385/37 |

* cited by examiner

PLANAR WAVEGUIDE-TYPE OPTICAL AMPLIFIER SWITCH

BACKGROUND OF THE INVENTION

1. Field of the Invention

The present invention relates to a planar waveguide-type optical amplifier switch which is an optically lossless small switch using optical gain materials directly for the optical switch waveguide along with optical pumping. The present invention provides a solution for the problems occuring in the prior art of optical switches in which the loss of light occurs and the volume of the switch gets larger because an additional optical amplifier is required for compensating the loss of light occurring in conventional optical waveguide-type switch elements used in optical systems such as an optical transmission, an optical distribution system, an optical exchange, and an optical signal processing.

2. Description of the Prior Art

A conventional waveguide-type optical switch used in an optical communication system requires an external optical amplifier to compensate the loss of light and thus is not suitable for an integrated system device in a small compact form. It is therefore an object of the present invention to solve the problem of the optical loss related to the prior art of waveguide-type optical switches and to provide a waveguide-type optical amplifier switch that can be formed in a simply integrated device by using an optical material with an optical amplifying characteristic for the waveguides and by inducing optical amplification of the switched optical signals under an optical pumping.

The present invention is applicable for a key device in optical communication systems, optical switching systems, optical amplifiers, and optical signal processing.

In the prior art there are several technologies, such as electrically controllable optical switches using an electro-optic effect, electrically controllable optical switches using a thermo-optic effect, optically controllable optical switches using an optical control beam, waveguide-type optical amplifiers using an optical pumping, and so on.

Detailed descriptions on the above mentioned prior art will be described referring to the drawings of FIG. 2 to FIG. 5.

In the drawings of FIG. 2 to FIG. 5, the numeric 1 represents a wavelength division multiplexing (WDM) optical coupler, the numeric 2 represents a fluorescence emitting ion-doped waveguide, the numeric 3 represents an electrically controllable refractive index varying electrodes, and the numeric 5 represents a general optical waveguide respectively. And L" represents a waveguide coupling length.

Figure 2:
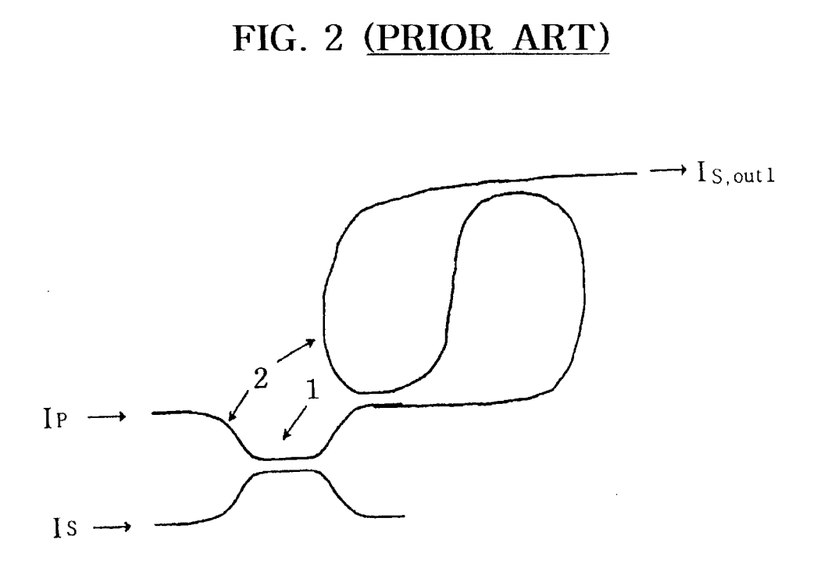
FIG. 2 is a schematic diagram of a conventional planar waveguide-type optical amplifier in the prior art.

FIG. 2 is a schematic diagram of a conventional planar waveguide-type optical amplifier that does not have a function of optical switch. [Y. Yan and A. J. Faber (EP 0867985), G. E. Blondee et al. (U.S. Pat. No. 5,039,190), Y. C. Yan et al. (Applied Physics Lett., Vol. 71, No 20, pp. 2922–2924, 1997)]. This structure has a defect that it can not provide a switching function because of the lack of an optical switch function in itself.

Figure 3:
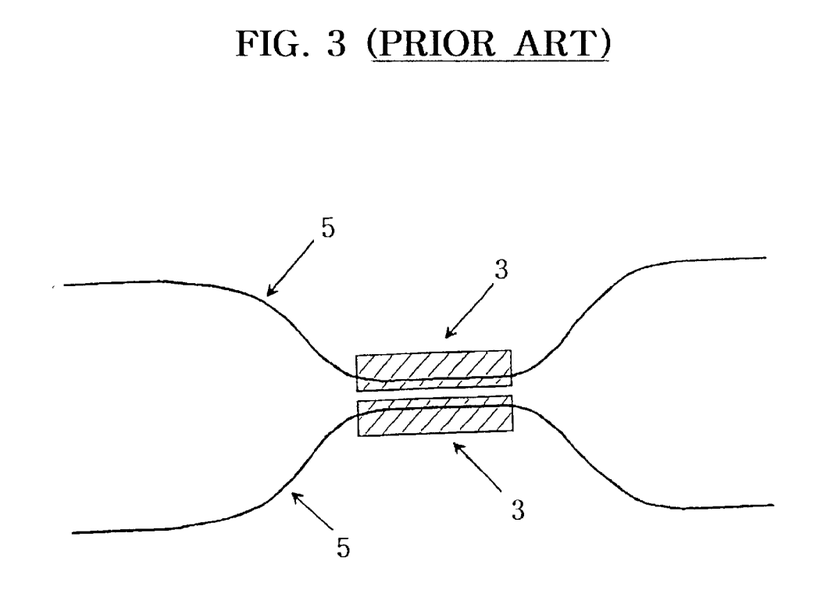
FIG. 3 is a schematic diagram of a conventional 2×2 electrically controllable planar waveguide-type optical switch in the prior art.

FIG. 3 is a schematic diagram of a conventional 2×2 electrically controllable planar waveguide-type optical switch that does not have a function of optical amplification. [W. T. Bourd, et al. (U.S. Pat. No. 4,759,595), H Okayama and M. Kawahara (J. Lightwave Technol, Vol. 11, No, 2, pp. 379–387, 1993)]. This structure has a defect that it additionally requires an external optical amplifier to compensate for the loss of the light occurring in an optical switch.

Figure 4:
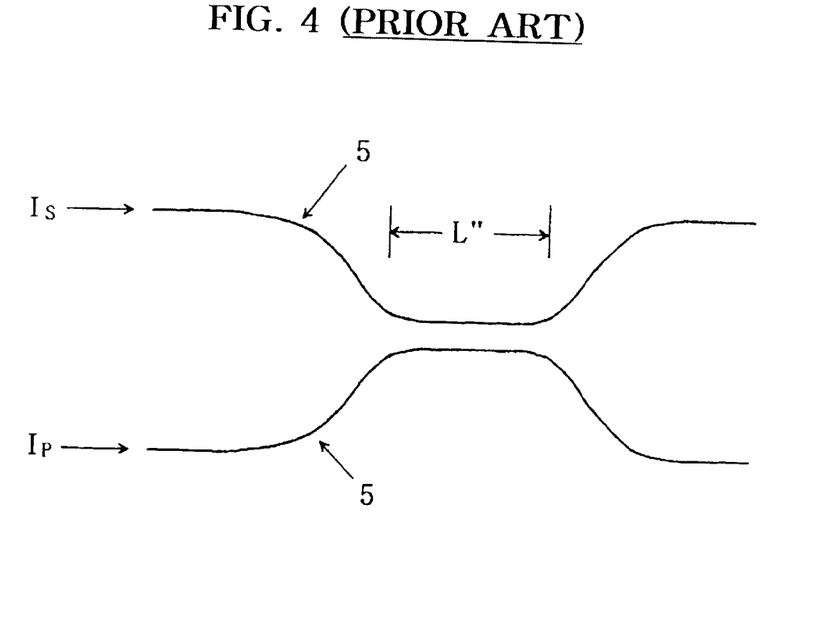
FIG. 4 is a schematic diagram of a conventional 2×2 optically controllable planar waveguide-type optical switch in the prior art.

FIG. 4 is a schematic diagram of a conventional 2×2 optically controllable planar waveguide-type optical switch that does not have a function of optical amplification. [M. J. F. Digonnet, et al., (U.S. Pat. No. 5,920,666)]. This structure, likewise the structure in FIG. 3, has a defect that it additionally requires an external optical amplifier to compensate for the loss of the light occurring in the optical switch.

Figure 5:
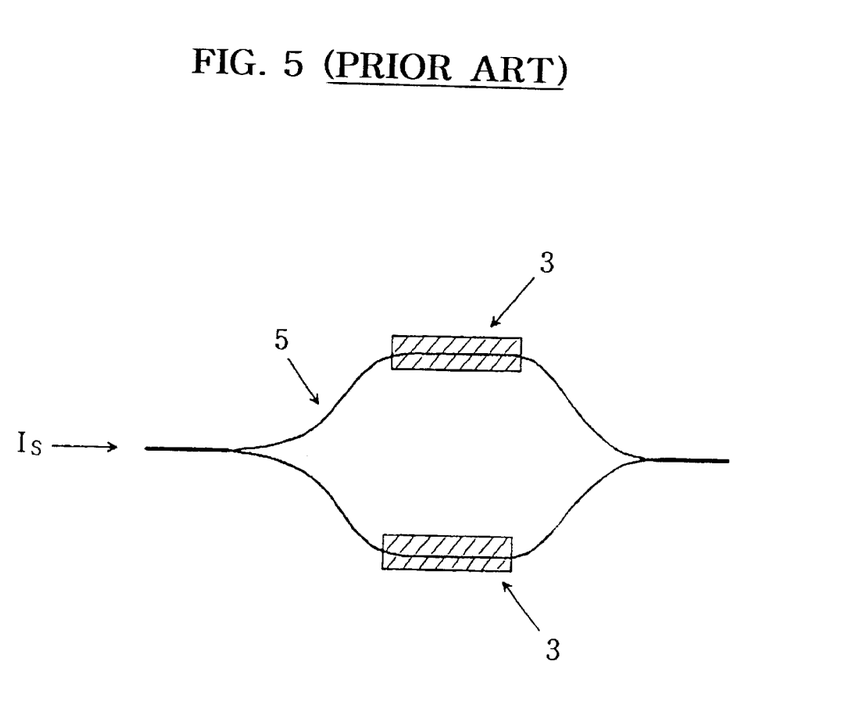
FIG. 5 is a schematic diagram of a conventional electrically controllable planar waveguide-type optical switch in the prior art using Mach-Zehnder interferometer.

FIG. 5 is a schematic diagram of a conventional electrically controllable planar waveguide-type optical switch using Mach-Zehnder interferometer, that does not have a function of optical amplification. This structure, likewise the structure in FIG. 3, has a defect that it additionally requires an external optical amplifier to compensate the loss of the light occurring in an optical switch.

That is, because the optical switches of the above mentioned second prior art to the fourth prior art have only the switching functions but have no amplifying functions, they require external optical amplifiers to compensate for the loss of the light occurring in the optical switches, and thereby have difficulty being formed into a compact integrated device. To solve this difficulty or problem, the present invention provides a structure of constituting a waveguide of an optical material that has a characteristic of optical gain to provide an optical amplification function to the switch itself.

Since the waveguide-type optical amplifier using an optical pumping described in the first prior art has only an amplifier but has no switching function, the present invention provides a waveguide amplifier structure having an optical switching function together.

In other words, because the optical switches of the above mentioned second prior art to the fourth prior art have only the switching function without amplifiers and the waveguide-type optical amplifier described in the first prior art has no switching function, there is a defect that, when these devices are being used, each of them should be fabricated independently and be combined to be used, thereby they can not be integrated into a simple compact device. The technical aspect of the present invention is to solve above mentioned problem of the loss of light that had existed in the conventional optical switches and thereby to provide an optical switch element that is more practical and is capable of being integrated in a compact lossless device.

A number of other prior arts includes (1) optical coupler type optical switches composed of active ion doped waveguides with pump controlled differential gain adjustment, [K. J. Blow (U.S. Pat. No. 5,583,957), M. Shigematsu, and K. Nakazato (U.S. Pat. No. 5,136,670)], (2) semiconductor based optical waveguide switches utilizing current-injected gain differences in a gain-guided channel or utilizing voltage-controlled refractive index change and control light absorption wavelength [M. Fujiware (U.S. Pat. No. 4,778,235), S. Nakamura (U.S. Pat. No. 5,329,601), N. Susuki (U.S. Pat. No. 5,754,714)], (3) thermo-optic waveguide switches utilizing a large temperature gradient on heating [N. Ooba, e al. (U.S. Pat. No. 6,122,416)], and (4) wavelength selective optical swithes utilizing grating assisted mode coupling [A. S. Kewitsch, et al. (U.S. Pat. No. 5,875,272)]. Among these prior arts the first and second types of switches can provide optical switching along with optical amplification during the switching functions, but they use different mechanisms from our invention. Operating speed of the first type optical switches are limited by the speed of the pump power change which may not be so fast as that of an all-optical switch using a separate high-speed control light injection just like the one proposed by our invention. The second type of optical switches are optical control type optical switches utilizing voltage applied optical absorption spectrum shifts or utilizing electrical current injected optical gains, while our invention uses optical pumped waveguide gain and optical control type optical switching. The latter two types of the prior arts have only switching mechanisms without optical signal amplification, which are different from our invention. Our invention also proposes potential high-speed optical control optical switches combined with an optical signal amplification function.

SUMMARY OF THE INVENTION

It is therefore an object of the present invention to provide a planar waveguide-type optical amplifier switch intended to solve the problems that the prior art have.

To achieve the object, the present invention amplifies an optical signal passing through a switch waveguide by performing an optical pumping through a wavelength division multiplexing optical coupler into the optical waveguide comprising a fluorescence emitting material, and at the same time, carries out an optical switching by using an optical waveguide refraction index change under an electrical control.

The present invention provides a waveguide-type optical amplifier switch, that carries out the function of amplifying the optical signal under an optical pump in co-propagating direction to the signal input and the function of switching the signal light simultaneously, and consists of a 2×2 optical coupler using an optical waveguide of a fluorescence emitting material; one or two input signal terminals; two output signal terminals; two electrically controllable electrodes that are located upon each waveguide corresponding to the coupling area of the coupler; two 2×1 or 2×2 wavelength division multiplexing optical waveguide couplers whose arms are installed upon the two input waveguides of the 2×2 optical coupler respectively to make the pump light propagate to the same direction as that of signal light; an input terminal for a pump light; and a Y-type optical power splitting waveguide that leads the divided pump lights by the power splitter to pass through a wavelength division multiplexing optical coupler and to incident to the input terminal of the 2×2 optical coupler.

The present invention also provides a waveguide-type optical amplifier switch, that carries out the function of amplifying the optical signal under an optical pump in counter-propagating direction to the signal input and the function of switching the signal light simultaneously, and consists of a 2×2 optical coupler using an optical waveguide of a fluorescence emitting material; one or two input signal terminals; two output signal terminals; two electrically controllable electrodes that are located upon each waveguide corresponding to the coupling area of the coupler; two 2×1 or 2×2 wavelength division multiplexing optical waveguide couplers whose arms are installed upon the two output waveguides of the 2×2 optical coupler respectively to make the pump light propagate in the reversed direction to the signal light; an input terminal for a pump light source; and a Y-type optical power splitting waveguide that leads the divided pump lights by the power splitter to pass through a wavelength division multiplexing optical coupler and to incident to the output terminal of the 2×2 optical coupler.

The present invention also provides a waveguide-type optical amplifier switch, that carries out the function of amplifying the optical signal under optical pump in co-propagating direction to the signal input and the function of switching the light simultaneously, and consists of a 2×1 or 2×2 wavelength division multiplexing optical waveguide-type coupler that is installed upon the input terminal side to make the pump light propagate to the same direction as that of signal light; input and output signal terminals; a pump light input terminal connected to the wavelength division multiplexing optical coupler; a Y-type 1×2 optical divider and a Y-type 2×1 optical coupler, both of which have an optical signal distributing function in the pump light and signal light; a pair of waveguides that constitute Mach-Zehnder interferometer by connecting the two arms of both the Y-type 1×2 optical divider and Y-type 2×1 optical coupler; and electrically controllable electrodes that are located upon the two arms of the pair of waveguide in pairs or upon one of the two arms of the pair.

The present invention also provides a waveguide-type optical amplifier switch, that carries out the function of amplifying the optical signal under optical pump in counter-propagating direction to the signal input and the function of switching the light simultaneously, and consists of a 2×1 or 2×2 wavelength division multiplexing optical waveguide-type coupler that is installed upon the output terminal side to make the pump light propagate to the reverse direction with respect to the signal light; input and output signal terminals; a pump light input terminal connected to the wavelength division multiplexing optical coupler; a Y-type 1×2 optical divider and a Y-type 2×1 optical coupler, both of which have an optical signal distributing function in the pump light and signal light; a pair of waveguides that constitute Mach-Zehnder interferometer by connecting the two arms of both the Y-type 1×2 optical divider and Y-type 2×1 optical coupler; and electrically controllable electrodes that are located upon the two arms of the pair of waveguide in pairs or upon one of the two arms of the pair.

The present invention also provides a waveguide-type optical amplifier switch, that amplifies an optical signal passing through the waveguide under an optical pumping coupled through a wavelength division multiplexing optical coupler into the optical waveguide comprising a fluorescence emitting material, and at the same time, carries out an optical switching by using an optical waveguide refraction index change under an optical control.

The present invention also provides a waveguide-type optical amplifier switch, that carries out the function of amplifying the optical signal under optical pump in co-propagating direction to signal input and the function of switching the light simultaneously, and consists of a 2×2 optical waveguide-type coupler made of a fluorescence emitting material; one or two input signal terminals; two output signal terminals; two 2×1 or 2×2 wavelength division multiplexing optical waveguide-type couplers that are installed upon the two input waveguides of the 2×2 optical coupler respectively to make the pump light propagate to the same direction as that of signal light; and two input terminals for pump light source.

The present invention also provides a waveguide-type optical amplifier switch, that carries out the function of amplifying the optical signal under optical pump in counter-propagating direction with respect to the signal input and the function of switching the light simultaneously, and consist of a 2×2 optical waveguide-type coupler made of a fluorescence emitting material; one or two input signal terminals; two output signal terminals; two 2×1 or 2×2 wavelength division multiplexing optical waveguide-type couplers that are installed upon the two output waveguides of the 2×2 optical coupler respectively to make the pump light propagate to the reverse direction with respect to the signal light travel; and two input terminals for pump light source.

BRIEF DESCRIPTION OF THE DRAWINGS

The above object and other advantages of the present invention will become more apparent by describing in detail the preferred embodiment of the present invention with reference to the attached drawings in which:

FIG. 1a to FIG. 1j are schematic diagrams of various types of planar waveguide-type optical amplifier switches in accordance with the present invention:

Similar reference characters refer to similar parts in the several viwers of the drawings.

DETAILED DESCRIPTION OF THE INVENTION

Figure 1A:
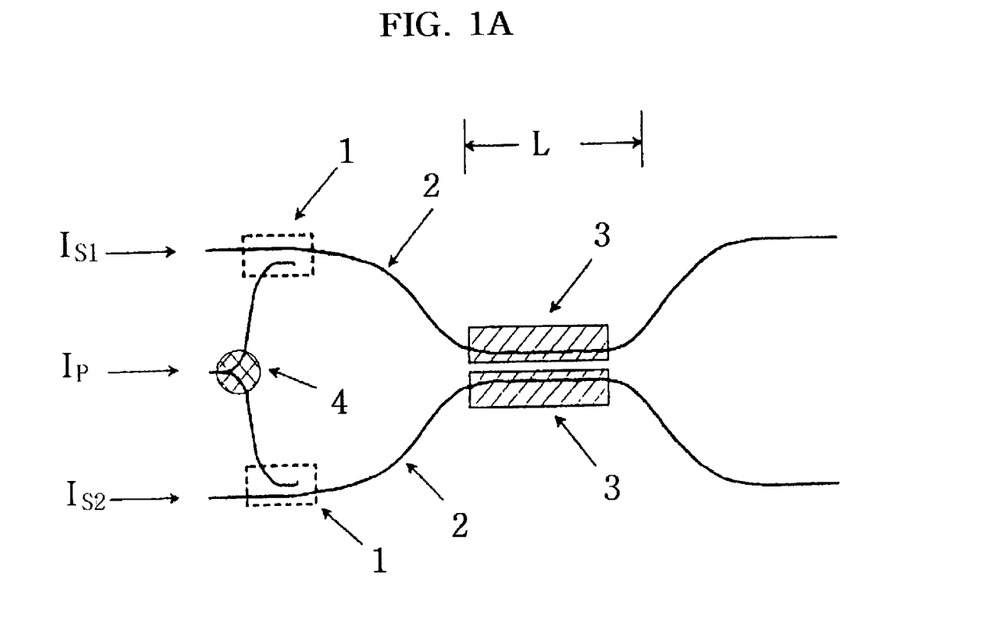
FIG. 1a is a schematic diagram of a 2×2 planar waveguide-type optical amplifier switch that is electrically controllable and optically pumped in co-propagating direction to optical signal by using a directional coupler.
Figure 1B:
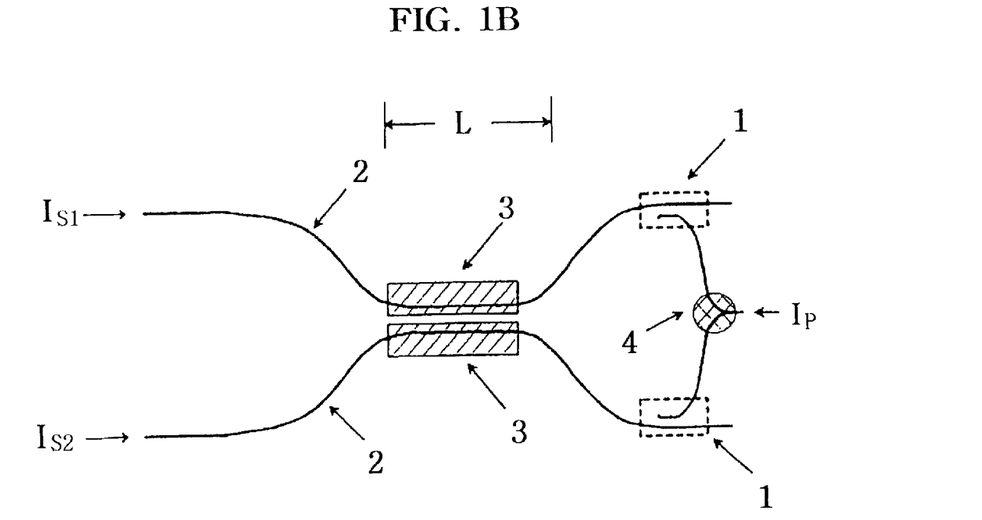
FIG. 1b is a schematic diagram of a 2×2 planar waveguide-type optical amplifier switch that is electrically controllable and optically pumped in counter-propagating direction with respect to optical signal by using a directional coupler.
Figure 1C:
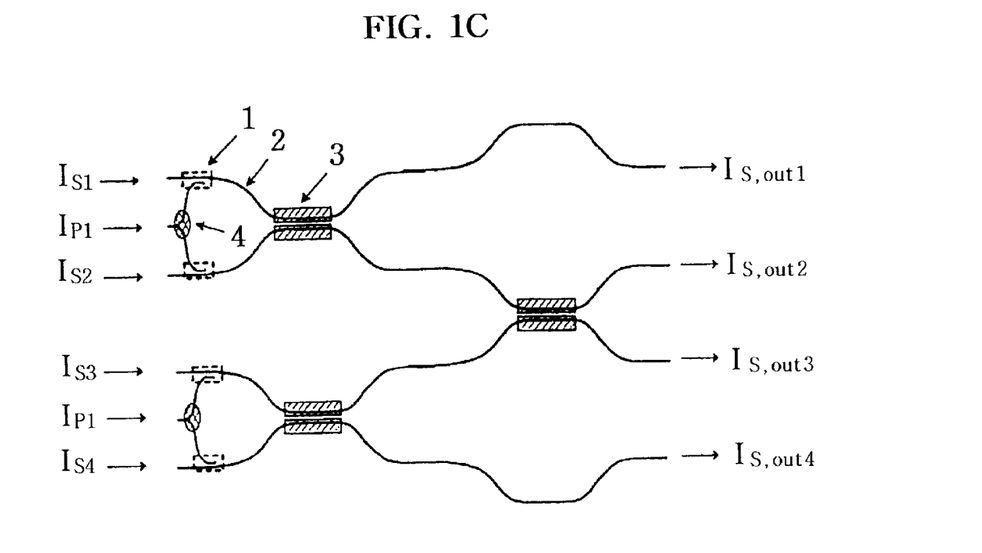
FIG. 1c is a schematic diagram of a 4×4 planar waveguide-type optical amplifier switch that is electrically controllable and optically pumped in co-propagating direction to optical signal by using a directional coupler.
Figure 1D:
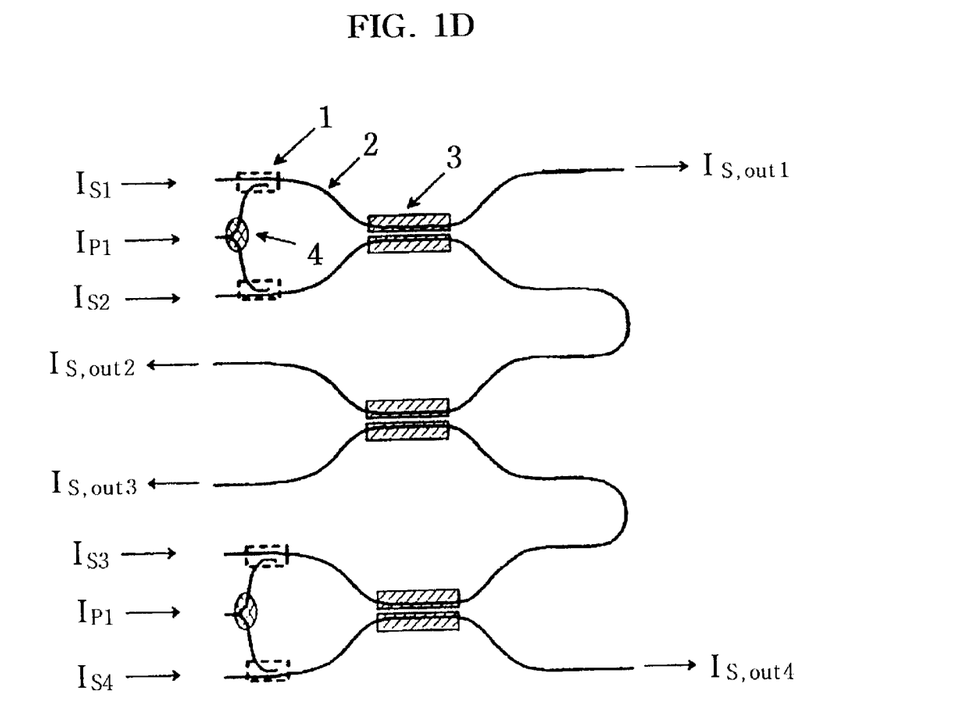
FIG. 1d is a folded schematic diagram of a 4×4 planar waveguide-type optical amplifier switch that is electrically controllable and optically pumped in co-propagating direction to optical signal by using a directional coupler.
Figure 1E:
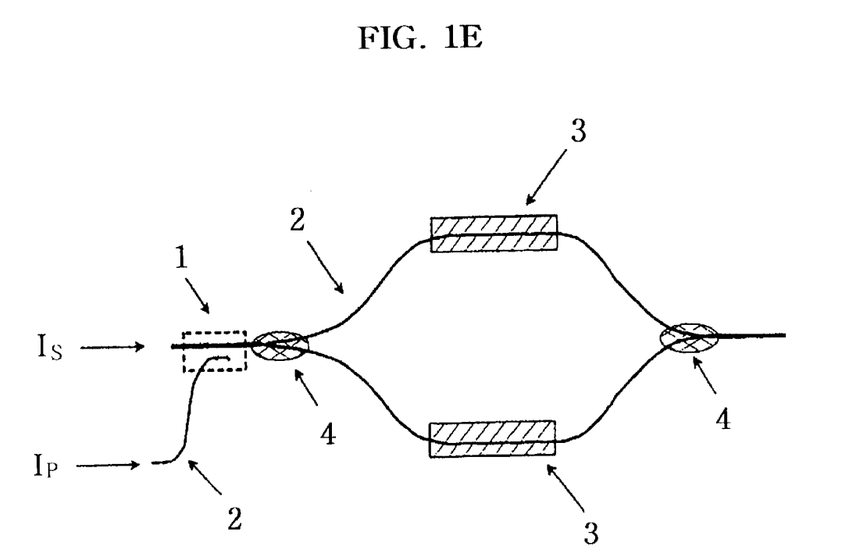
FIG. 1e is a schematic diagram of a planar waveguide-type optical amplifier switch that is electrically controllable and optically pumped in co-propagating direction to optical signal by using Mach-Zehnder interferometer.
Figure 1F:
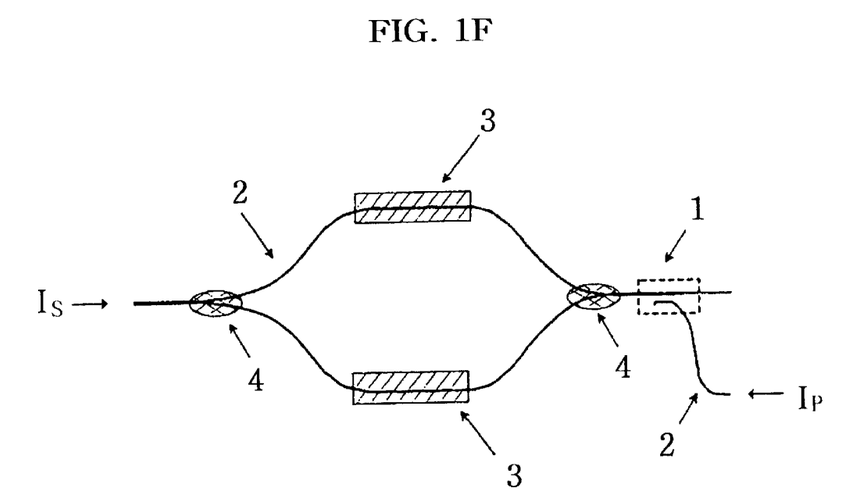
FIG. 1f is a schematic diagram of a planar waveguide-type optical amplifier switch that is electrically controllable and optically pumped in counter-propagating direction with respect to optical signal by using Mach-Zehnder interferometer.
Figure 1G:
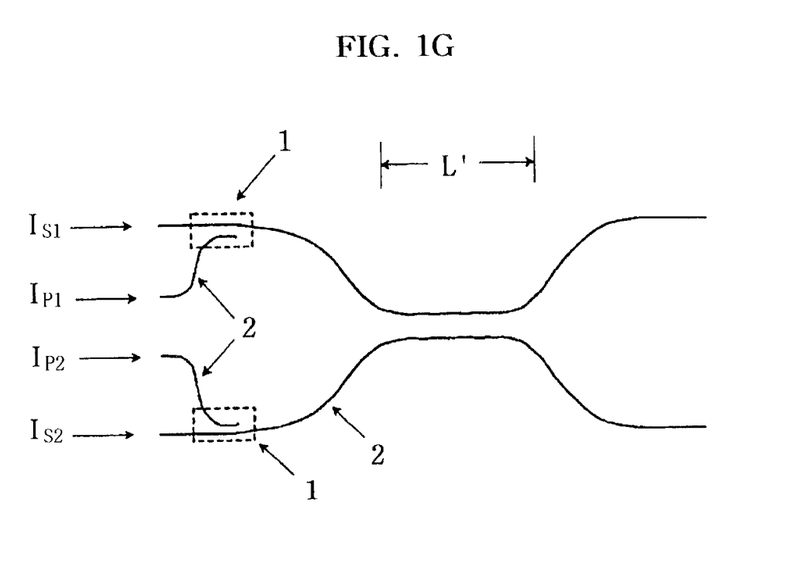
FIG. 1g is a schematic diagram of a 2×2 planar waveguide-type optical amplifier switch that is optically controllable and optically pumped in co-propagating direction to optical signal by using a directional coupler.
Figure 1H:
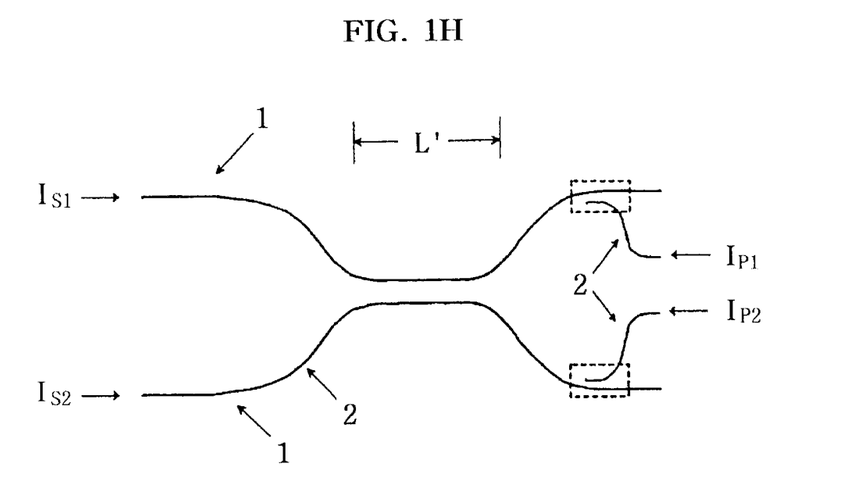
FIG. 1h is a schematic diagram of a 2×2 planar waveguide-type optical amplifier switch that is optically controllable and optically pumped in counter-propagating direction with respect to optical signal by using a directional coupler.
Figure 1I:
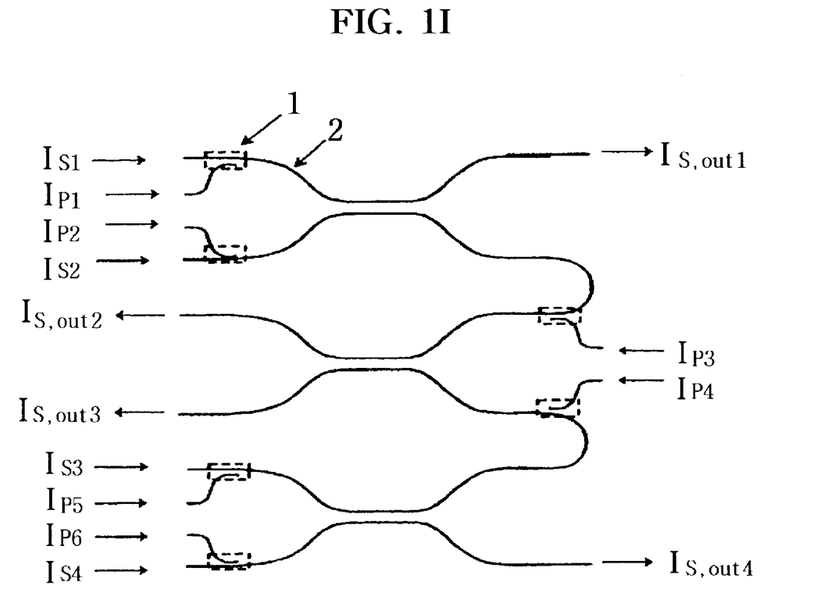
FIG. 1i is a schematic diagram of a 4×4 planar waveguide-type optical amplifier switch that is optically controllable and optically pumped in co-propagating direction to optical signal by using a directional coupler.
Figure 1J:
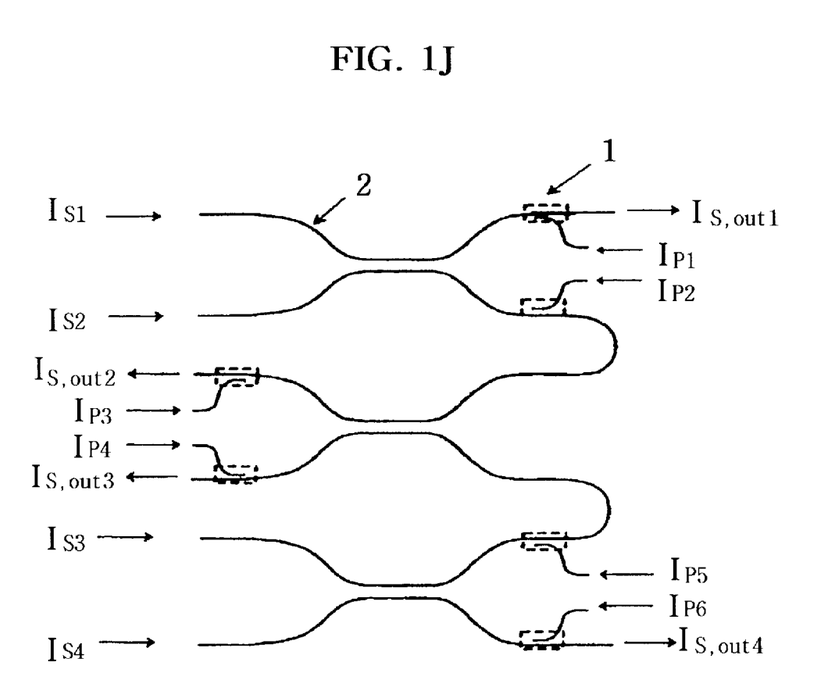
FIG. 1j is a schematic diagram of a 4×4 planar waveguide-type optical amplifier switch that is optically controllable and optically pumped in counter-propagating direction with respect to optical signal by using a directional coupler.

Referring to appended drawings of FIG. 1 a to FIG. 1j, detailed description of the present invention is now described.

FIG. 1a to FIG. 1j are schematic diagrams of various types of waveguide-type optical amplifier switches proposed by the present invention, that optically pump the light, which is distributed by an optical power splitter 4 into an optical waveguide 2 employing a fluorescence emitting material, through a wavelength division multiplexing optical coupler 1 and amplify an optical signal passing through the waveguide 2, and at the same time, carries out an optical switching by using an optical waveguide refraction index change by an electric control or an optical control using electrically controllable refractive index varying electrodes 3. Here, L and L' represent the waveguide coupling lengths that are determined to carry out the switching easily by an electrical control and an optical control respectively.

Fluorescence emitting materials which can be used in the optical waveguide include rare-earth-ion doped optical material, transition-metal-ion doped material, and nonlinear optical material.

FIG. 1a is a schematic diagram of a waveguide-type optical amplifier switch that carries out a function of optical amplifiers pumped in co-propagating direction to the optical signal and a function of light switching by using a waveguide refractive index change by an electro-optic effect or a thermo-optic effect in an optical coupler.

FIG. 1b is a schematic diagram of a waveguide-type optical amplifier switch that carries out a function of optical amplifiers pumped in counter-propagating direction with respect to the optical signal and a function of light switching by using a waveguide refractive index change by an electro-optic effect or a thermo-optic effect in an optical coupler.

FIG. 1c is a schematic diagram of a 4×4 waveguide-type optical amplifier switch comprising the signal light and two waveguide-type optical amplifier switches optically pumped in co-propagating direction to optical signal as described in FIG. 1a, and a waveguide-type switch that does not have an optical pump.

FIG. 1d is a schematic diagram of a 4×4 waveguide-type optical amplifier switch in which the input terminals of the waveguide-type switch that does not have an optical pump in FIG. 1c are located in countered direction to each other between the two 2×2 waveguide-type optical amplifier switches optically pumped in co-propagating direction to optical signal in FIG. 1c and are connected to the output terminals of these switches respectively.

FIG. 1e is a schematic diagram of a waveguide-type optical amplifier switch that carries out a function of optical amplifiers pumped in co-propagating direction to the optical signal and a function of light switching by using Mach-Zehnder interferometer and causing the phase difference between the optical signals propagating through the two arms of the interferometer by giving a difference in a refractive index change of each arm by an electrical control.

FIG. 1f is a schematic diagram of a Mach-Zehnder interferometer-type planar waveguide-type optical amplifier switch similar to the switch in FIG. 1e, but pumps in counter-propagating direction instead of co-propagating direction.

FIG. 1g is a schematic diagram of a waveguide-type optical amplifier switch similar to the switch in FIG. 1a, but employs an optical control, instead of an electrical control, that causes the phase change of optical signal, which is propagating through the coupling area of the optical coupler, by giving a difference in the intensity of pump light co-propagating to each input terminal through a wavelength division multiplexing optical coupler.

FIG. 1h is a schematic diagram of a waveguide-type optical amplifier switch similar to the switch with an optical control as described in FIG. 1g, but pumps in counter-propagating direction instead of co-propagating direction.

FIG. 1*i* is a schematic diagram of a 4×4 waveguide-type optical amplifier switch, in which three of the co-propagating directionally pumped 2×2 optically controllable waveguide-type optical amplifier switch in FIG. 1*g* are placed across each other so that the overall structure is similar to that of FIG. 1*d*. In this structure, because two optical amplifier pumps and switch control lights are required for each 2×2 optically controllable waveguide-type optical amplifier switch, six pumps and control lights are eventually required.

FIG. 1*j* is a schematic diagram of a 4×4 optically controllable waveguide-type optical amplifier switch similar to the switch in FIG. 1*i*, but pumps in counter-propagating direction instead of co-propagating direction.

As mentioned above, to eliminate the defect that, in the prior art, a waveguide-type optical amplifier and an optical switch should be fabricated independently and be united to be used, thereby the volume gets larger and the integration is difficult, a planar waveguide-type optical amplifier switch proposed in the present invention is constituted to fabricate a waveguide of a fluorescence emitting material and install a wavelength division multiplexing optical coupler and an optical switch thereon, thereby amplify an optical signal passing through the waveguide by an optical pumping, and at the same time, carry out an optical switching by an electric control or an optical control. The present invention has an advantage that, by compensating the light loss of the conventional waveguide-type switch element, that is used in the technical areas of an optical transmission, an optical distribution system, an optical exchange, an optical signal treatment and so on, with employing an amplification process in itself, the optical switch without light loss can be achieved and the integration can be obtained easily. It therefore has desirable effects that, by eliminating the problem of light loss in the conventional waveguide-type optical switch, the application in the various technical fields such as an optical transmission, an optical distribution system, an optical exchange, and an optical signal treatment is widely available from now on, and it also makes a massive optical signal treatment technique possible. Beside of the applicable fields mentioned above, it has a numerous applicable fields within the scope of the present invention.

Since those having ordinary knowledge and skill in the art of the present invention will recognize additional modifications and applications within the scope thereof, the present invention is not limited to the embodiments and drawings described above.

To solve the problem that, in the prior art, because the conventional optical switch has a switching function only without having an amplifying function, it requires an external optical amplifier to compensate the light loss occurring in it, thereby has a difficulty in being integrated, the waveguide-type optical amplifier switch provided in the present invention switches an optical signal and amplifies the switched optical signal simultaneously, thereby achieve an optical switch element that is more practical and is capable of being integrated simply. The optical amplifier switch in accordance with the present invention can replace the conventional optical switches of the prior art and, corresponding to the establishment of a massive optical communication system, it can lead a technical development in the technical areas such as a massive optical signal treatment, an optical switching, an optical computer and so on.

What is claimed is:

1. A waveguide-type optical amplifier switch that amplifies an optical signal passing through a waveguide by performing an optical pumping through a wavelength division multiplexing optical coupler in said optical waveguide comprising a fluorescence emitting electro-optic material, and at the same time, carries out an optical switching by using an optical waveguide refraction index change induced by an electro-optic effect under an electrical control.

2. A waveguide-type optical amplifier switch, that carries out the function of amplifying the optical signal under optical pump in co-propagating direction to the signal travel and the function of switching the signal simultaneously, comprising:

a 2×2 optical waveguide-type coupler made of a fluorescence emitting material;

one or two input signal terminals;

two output signal terminals;

two electrically controllable electrodes that are located upon each waveguide corresponding to the coupling area of said coupler, said electrically controllable electrodes for inducing a refractive index change of each waveguide by an electro-optic effect;

two 2×1 or 2×2 wavelength division multiplexing optical waveguide-type couplers, that are installed upon the two input waveguide of 2×2 optical coupler respectively to make the pump light propagate to the same direction as that of signal light;

an input terminal for a pump light source; and a Y-type optical power splitting waveguide that divides pump light into two and passes them through said wavelength division multiplexing optical couplers to incident to the input terminals of said 2×2 optical coupler.

3. A waveguide-type optical amplifier switch, that carries out the function of amplifying the optical signal under optical pump in counter-propagating direction with respect to the optical signal travel and the function of switching the signal simultaneously, comprising:

a 2×2 optical waveguide-type coupler made of a fluorescence emitting material;

one or two input signal terminals;

two output signal terminals;

two electrically controllable electrodes that are located upon each waveguide corresponding to the coupling area of said coupler, said electrically controllable electrodes for inducing a refractive index change of each waveguide by an electro-optic effect;

two 2×1 or 2×2 wavelength division multiplexing optical waveguide-type couplers that are installed upon the two output waveguide of said 2×2 optical coupler respectively to make the pump light propagate in the reverse direction to that of signal light;

an input terminal for a pump light source; and a Y-type optical power splitting waveguide that divides the pump light into two and passes them through said wavelength division multiplexing optical couplers to incident to the input terminals of said 2×2 optical coupler.

4. The waveguide-type optical amplifier switch as claimed in claim 1, wherein said fluorescence emitting material comprises a rare-earth-ion doped optical material.

5. The waveguide-type optical amplifier switch as claimed in claim 1, wherein said electric control is using an thermo-optical effect of an 2×2 optical coupler and determines the optical coupling length to cause a switching.

* * * * *